(12) United States Patent
Chang et al.

(10) Patent No.: US 8,461,056 B1
(45) Date of Patent: Jun. 11, 2013

(54) SELF-ALIGNED WET ETCHING PROCESS

(75) Inventors: Wei-Che Chang, Taichung (TW);
Chun-Hua Huang, Taichung (TW);
Chung-Yung Ai, Taichung (TW);
Wei-Chih Liu, Taichung (TW);
Hsuan-Yu Fang, Taichung (TW);
Yu-Ling Huang, Taichung (TW);
Meng-Hsien Chen, Taichung (TW);
Chun-Chiao Tseng, Taichung (TW);
Yu-Shan Hsu, Taichung (TW); Kazuaki Takesako, Taichung (TW); Hirotake Fujita, Taichung (TW); Tomohiro Kadoya, Taichung (TW); Wen Kuei Hsu, Taichung (TW); Chih-Wei Hsiung, Taichung (TW); Yukihiro Nagai, Taichung (TW); Yoshinori Tanaka, Taichung (TW)

(73) Assignee: Rexchip Electronics Corporation, Taichung (TW)

( * ) Notice: Subject to any disclaimer, the term of this patent is extended or adjusted under 35 U.S.C. 154(b) by 0 days.

(21) Appl. No.: 13/327,157

(22) Filed: Dec. 15, 2011

(51) Int. Cl.
*H01L 21/302* (2006.01)
(52) U.S. Cl.
USPC .................... 438/751; 438/749; 257/E21.546

(58) Field of Classification Search
USPC .......................... 438/749, 750, 751, 756, 757
See application file for complete search history.

(56) References Cited

U.S. PATENT DOCUMENTS

| 6,596,607 | B2 * | 7/2003 | Ahn | 438/424 |
| 7,498,233 | B2 * | 3/2009 | Kim et al. | 438/437 |

* cited by examiner

*Primary Examiner* — Charles Garber
*Assistant Examiner* — Reema Patel
(74) *Attorney, Agent, or Firm* — Muncy, Geissler, Olds & Lowe, PLLC

(57) ABSTRACT

A self-aligned wet etching process comprises the steps of: etching a substrate having an etch protection layer on a surface thereof to form a plurality of trenches spaced from each other; and sequentially forming an insulating layer, an etch stop layer and a primary insulator in each trench, wherein the primary insulator is filled inside an accommodation space surrounded by the etch stop layer. During the wet etching process, the etch stop layer protects the primary insulator from being etched, whereby is achieved anisotropic wet etching. Further, the present invention expands the contact areas for electrically connecting with external circuits and exempts the electric contactors formed on the contact areas from short circuit caused by excessively etching the primary insulators.

5 Claims, 14 Drawing Sheets

SELF-ALIGNED WET ETCHING PROCESS

FIELD OF THE INVENTION

The present invention relates to a semiconductor fabrication process, particularly to a self-aligned wet etching process.

BACKGROUND OF THE INVENTION

With technical advance, the feature size of IC and the volume of a single IC chip have been greatly reduced. Therefore, a circuit board can accommodate more electronic elements, and the fabrication cost of electronic products is lowered. Refer to FIGS. 1A-1D sectional views schematically showing the fabrication process of a vertical transistor. Firstly, etch a substrate 1 having an etch protection layer 2 on the surface thereof to form a plurality of trenches 3 spaced from each other. Next, fill an insulating material into the trenches 3 to form a plurality of insulators 4. Because of reduction of the feature size, the spacing d1 between two adjacent insulators 4 becomes more and more narrow. Refer to FIG. 1B. Next, remove the etch protection layer 2. As the spacing d1 has been reduced, the contact window 5 becomes smaller than before. Thus, the succeeding process becomes harder. Refer to FIG. 1C. Next, etch the insulators 4 to expand the contact windows 5. Refer to FIG. 1D. Next, form electric conductors 6 in the contact windows 5. Via the abovementioned technology, the contact area of the electric conductors 6 and the substrate 1 would not be too small to affect electric conduction. The insulators 4 are normally etched by a wet etching process. The wet etching process is an isotropic etching that etches toward all directions uniformly. The etching rate and etching time of the wet etching process is hard to control. Therefore, the wet etching process is likely to cause uneven thickness of the insulators 4 or even completely remove the insulators 4. In such a case, the adjacent electric conductors 6 are hard to effectively insulate, and the short circuit of the electric conductors 6 may take place.

SUMMARY OF THE INVENTION

The primary objective of the present invention is to solve the problem that the conventional wet etching process is hard to control the precision of isotropic etching and likely to bring about short circuit problem in the succeeding process.

To achieve the above-mentioned objective, the present invention proposes a self-aligned wet etching process, which comprises the steps of:

Step S1: etching a substrate having an etch protection layer on the surface thereof to form a plurality of trenches spaced from each other;

Step S2: sequentially forming an insulating layer and an etch stop layer on the surface of each trench to form an accommodation space inside the etch stop layer;

Step S3: filling a primary insulator inside the accommodation space, wherein the primary insulator integrates with the etch stop layer and the insulating layer to form a multi-layer isolator;

Step S4: removing the etch protection layer to expose a portion of the isolator outside the substrate;

Step S5: removing the insulating layer exposing outside the substrate through a wet etching solution, wherein the primary insulator is protected by the etch stop layer and exempted from being etched by the wet etching solution;

Step S6: removing the etch stop layer exposing outside the substrate to expose a portion of the primary insulator outside the substrate; and Step S7: forming a plurality of electric contactors on the substrate that are separated by the primary insulator.

The present invention uses the etch stop layer to protect the primary insulator from being etched by the wet etching solution, whereby are overcome the problem of uneven etched thickness caused by that the etching rate and etching time are hard to control, and the problem of short circuit occurring to the electric contactors caused by excessively etching.

DETAILED DESCRIPTION OF THE PREFERRED EMBODIMENTS

The technical contents of the present invention are described in detail in cooperation with drawings below.

Figure 1A:
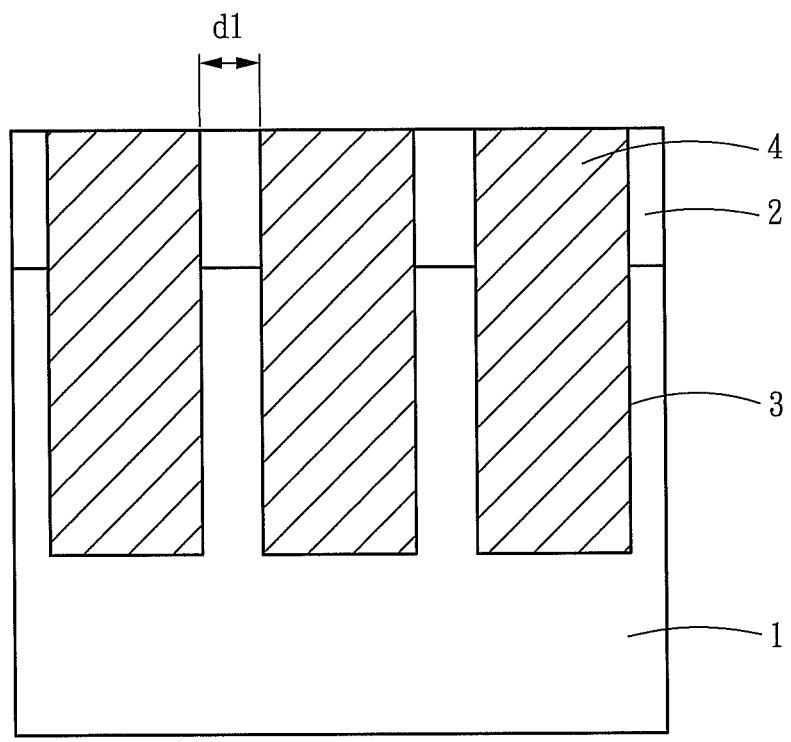
FIGS. 1A-1D are sectional views schematically showing a conventional fabrication process of a vertical transistor.
Figure 1B:
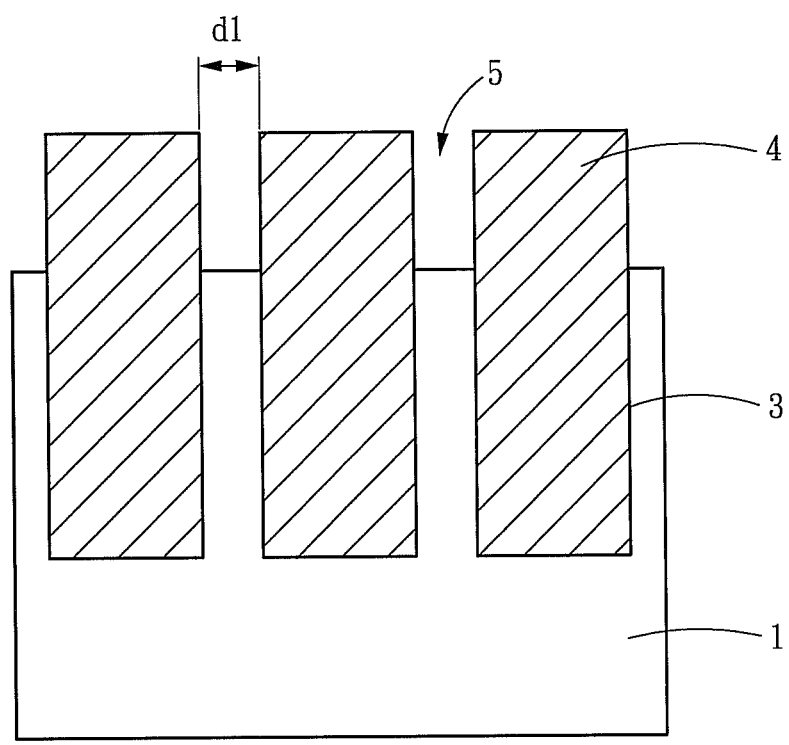
Figure 1C:
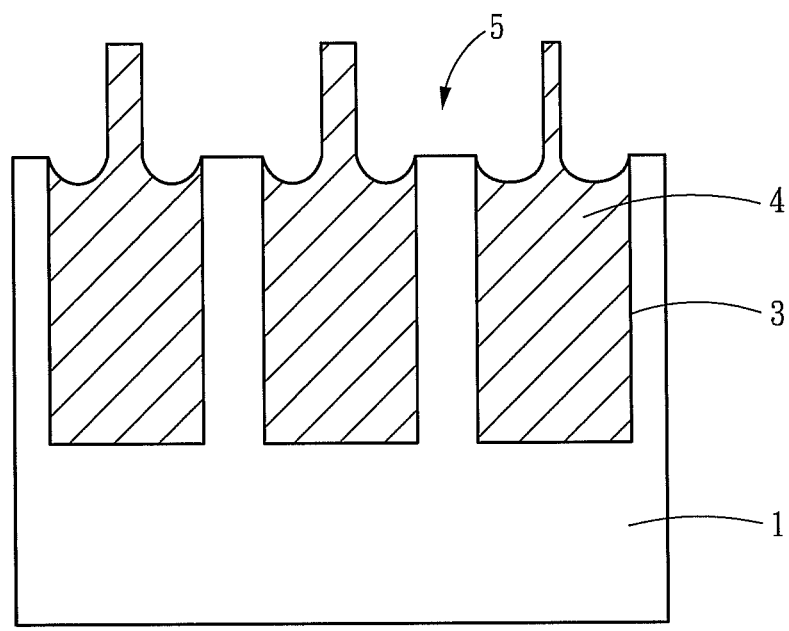
Figure 1D:
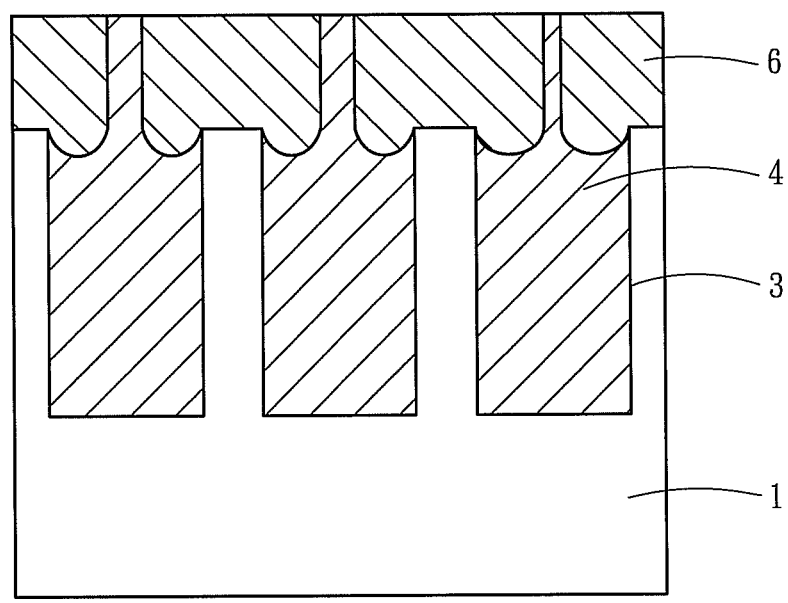
Figure 2A:
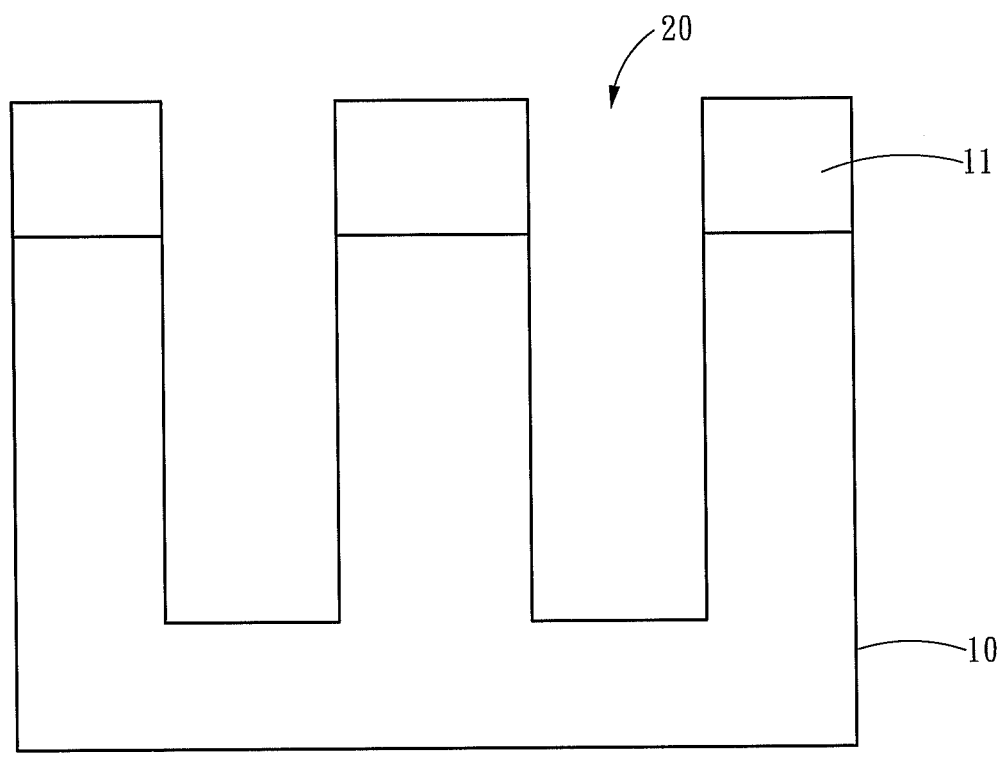
FIGS. 2A-2G are sectional views schematically showing a self-aligned etch process according to one embodiment of the present invention.

Refer to FIGS. 2A-2G. The present invention proposes a self-aligned wet etching process, which comprises steps of:

Step S1—forming a plurality of trenches 20 as shown in FIG. 2A. In Step S1, a substrate 10 having an etch protection layer 11 on the surface thereof is etched to form a plurality of trenches 20 spaced from each other. In one embodiment, the etch protection layer 11 is made of silicon nitride, and the substrate 10 is made of silicon. In the embodiment shown in FIGS. 2A-2G the fabrication of a vertical transistor is used exemplify the present invention. Each strip-like region between two neighboring trenches 20 may be doped with ions to function as the source and drain of the transistor. However, the method of ion doping is not the focus of the present invention. Thus, it is not further described in the specification.

Figure 2B:
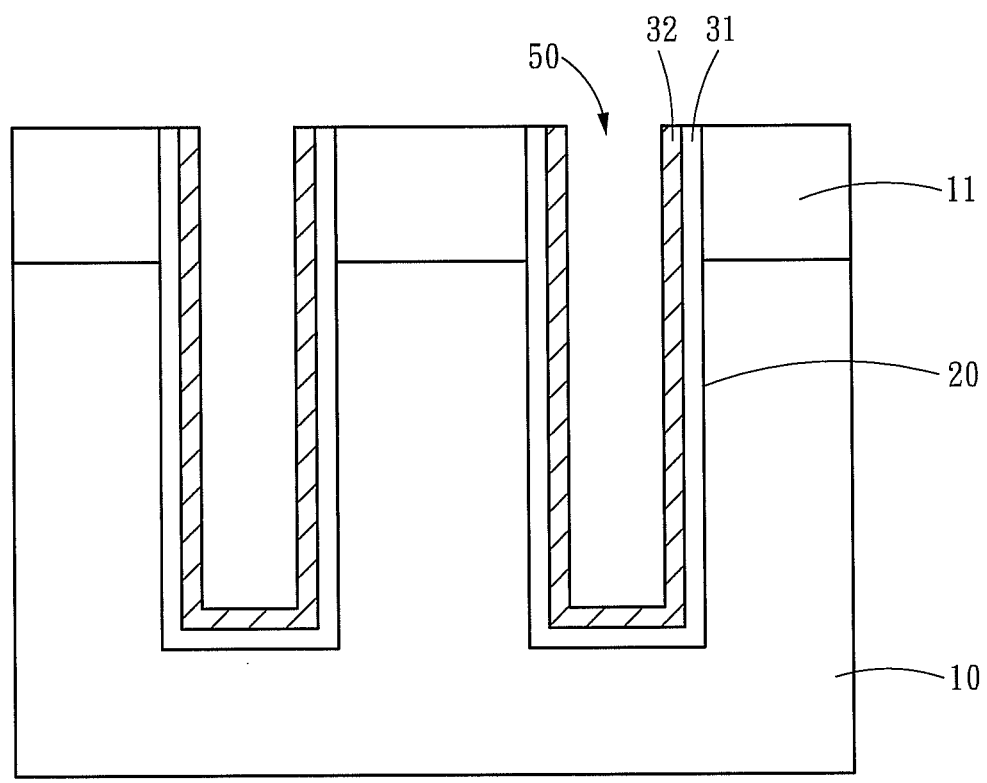

Step S2—sequentially forming an insulating layer 31 and an etch stop layer 32 on the surface of each trench 20 as shown in FIG. 2B. After the insulating layer 31 and etch stop layer 32 are formed on the inner surface of each trench 20, an accommodation space 50 is formed inside the etch stop layer 32. In one embodiment, the insulating layer 31 is made of silicon dioxide, and the etch stop layer 32 is made of silicon nitride.

Figure 2C:
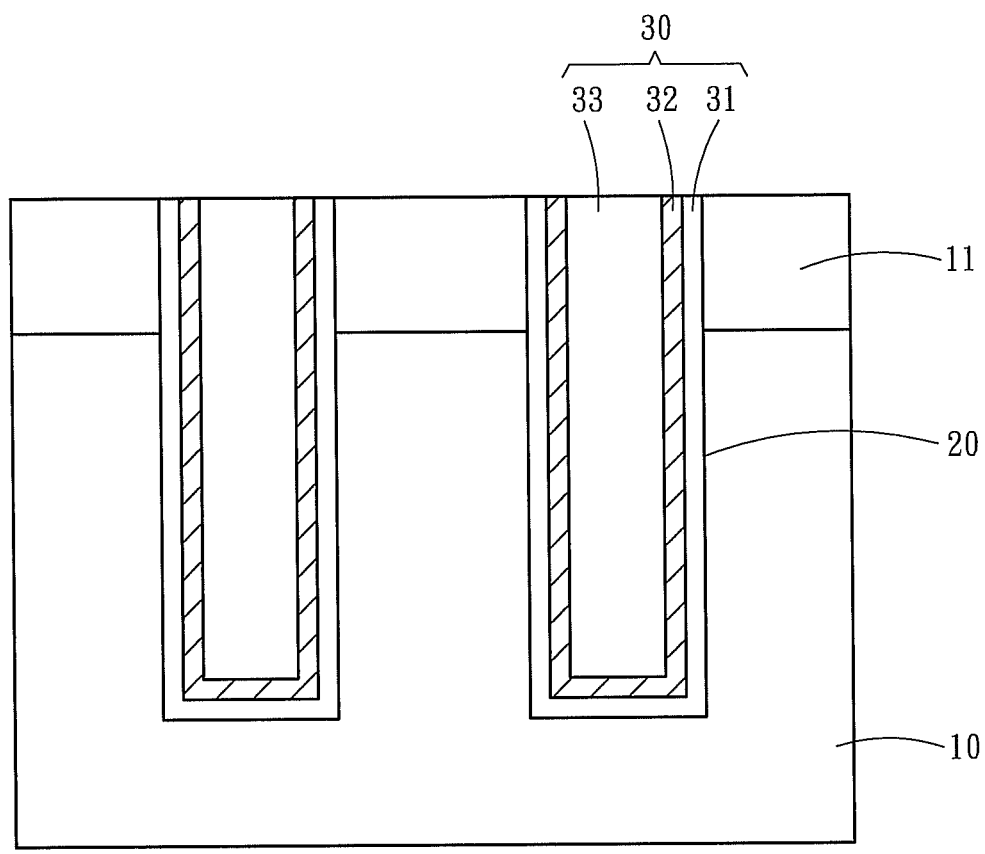

Step S3—filling a primary insulator 33 inside the accommodation space 50 as shown in FIG. 2C. The primary insulator 33 integrates with the etch stop layer 32 and the insulating layer 31 to form a multi-layer isolator 30. In one embodiment, the primary insulator 33 is made of silicon dioxide.

Figure 2D:
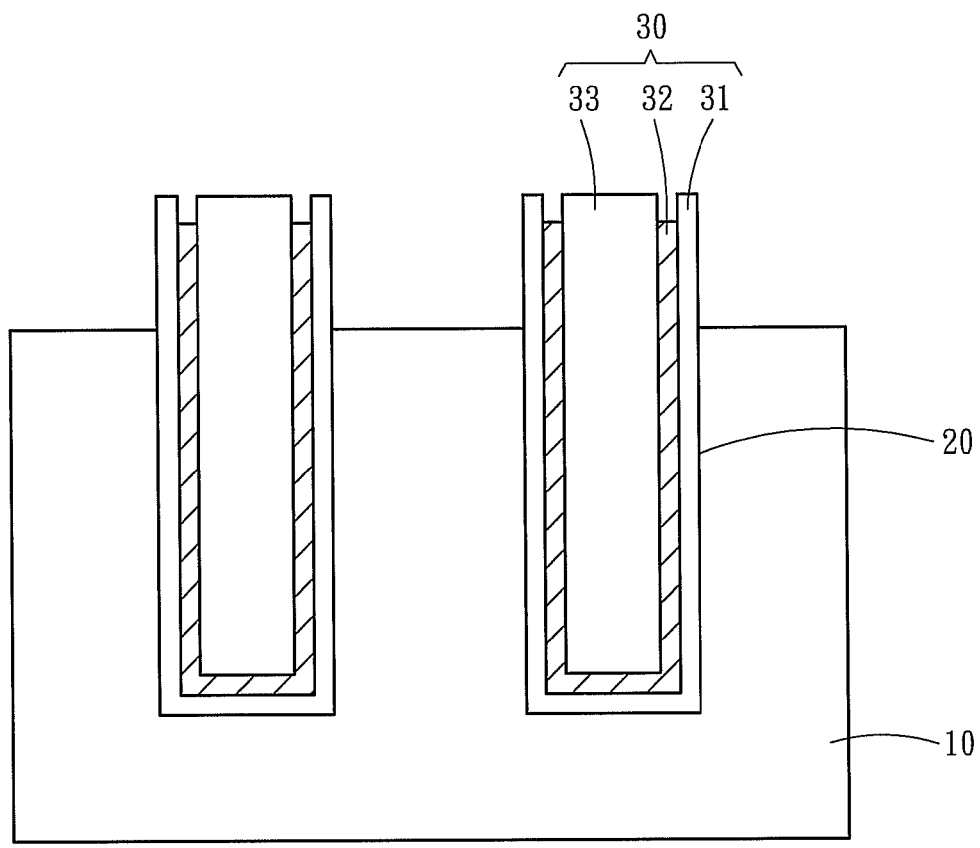

Step S4—removing the etch protection layer 11 as shown in FIG. 2D. A portion of the isolator 30 is exposed outside the substrate 10 via removing the etch protection layer 11. In other words, the insulating layer 31, etch stop layer 32 and primary insulator 33 are partially protruded outside the substrate 10. In one embodiment, the material of the etch stop layer 32 is the same as that of the etch protection layer 11. Therefore, the etch stop layer 32 is also partially etched when the etch protection layer 11 is removed. Thus, the etch stop layer 32 is formed at a height slightly lower than the insulating layer 31 and the primary insulator 33. Via the protection of the insulating layer 31, the etch stop layer 32 is exempted from being removed when the etch protection layer 11 is removed.

Figure 2E:
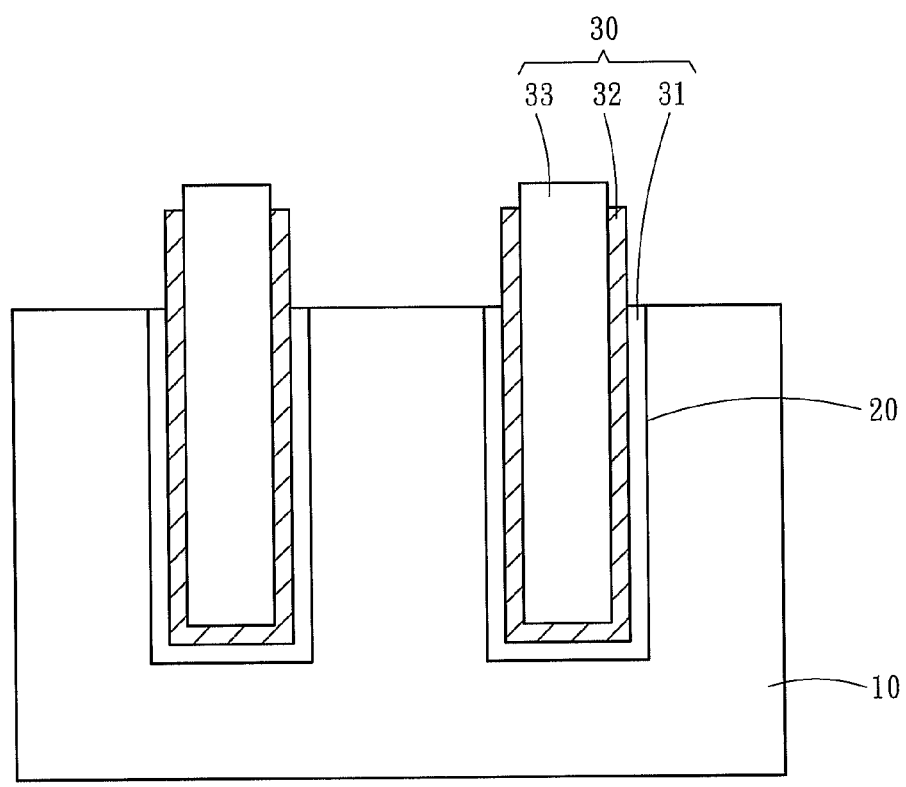

Step S5—removing a portion of the insulating layer 31 as shown in FIG. 2E. In Step S5, the insulating layer 31 exposing outside the substrate 10 is removed through a wet etching solution, but the primary insulator 33 is protected by the etch stop layer 32 and exempted from being etched by the wet etching solution. The etch stop layer 32 can prevent from uneven etched depth and thickness caused by that etching rate or etching time is hard to control, and eliminate the excessive etching problem.

Figure 2F:
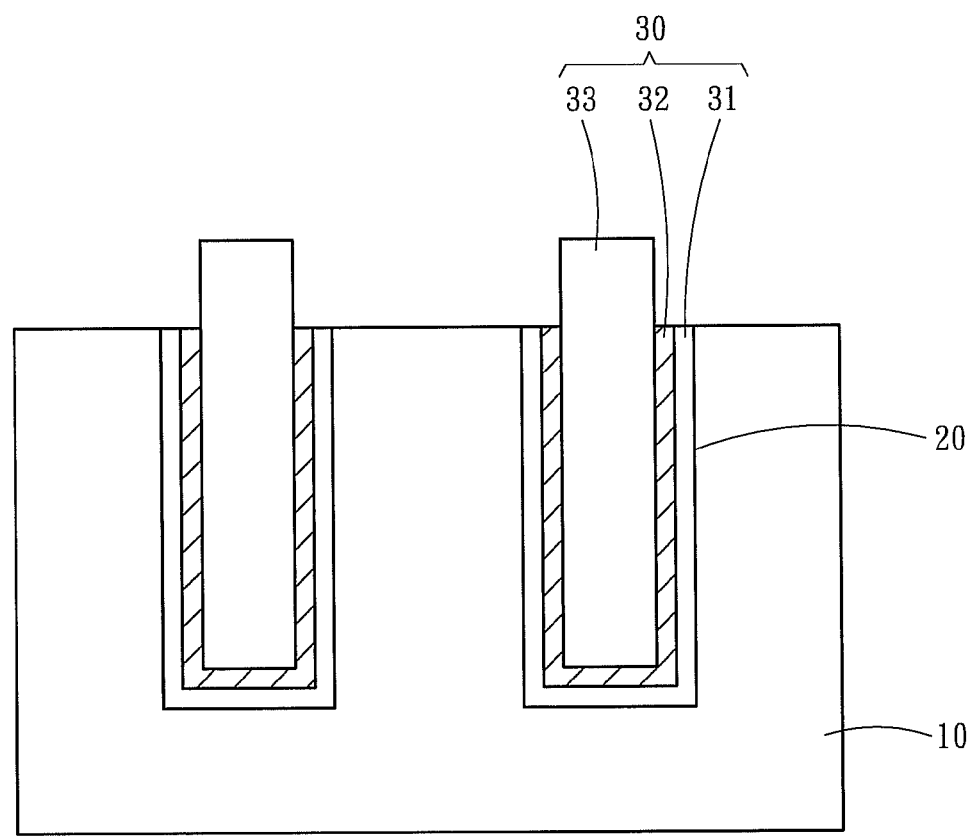

Step S6—removing the etch stop layer 32 exposing outside the substrate 10 as shown in FIG. 2F. In Step S6, a portion of the primary insulator 33 exposes outside the substrate 10 when the etch stop layer 32 is removed. Thereby, the spacing between the neighboring primary insulators 33 is greater than the spacing between the neighboring trenches 20. Thus are formed on the surface of the substrate 10 the contact windows having sufficient size for the succeeding process.

Figure 2G:
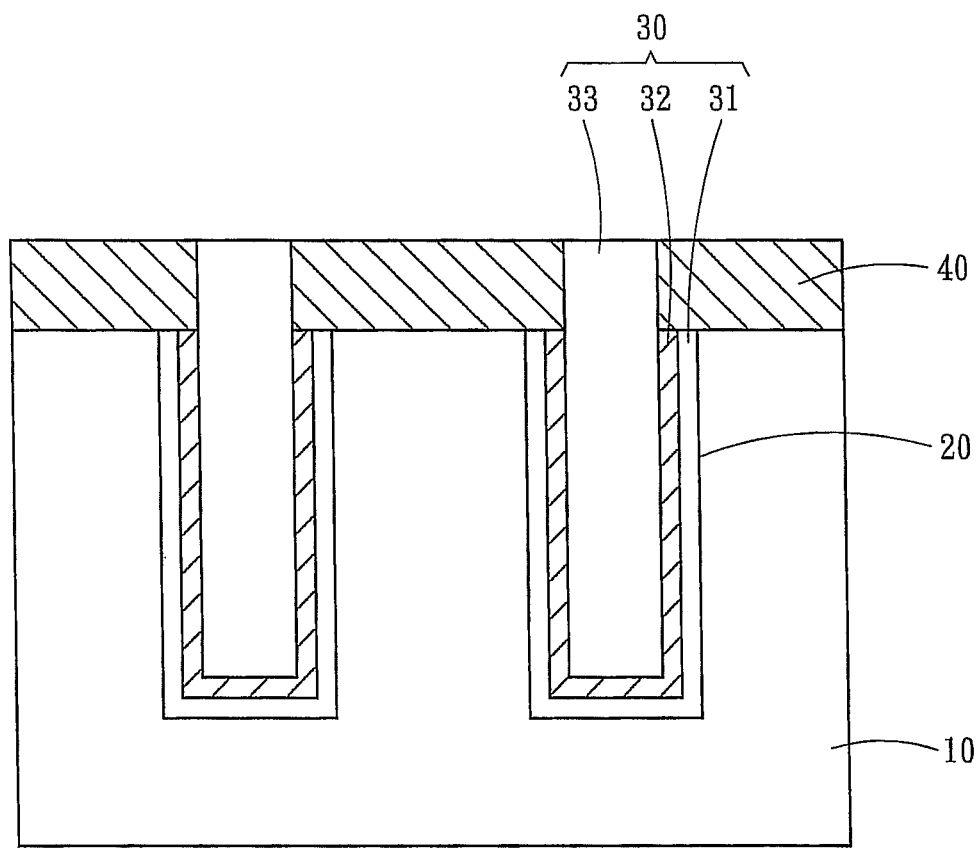

Step S7—forming a plurality of electric contactors 40 on the substrate 10 as shown in FIG. 2G. In Step S7, a plurality of electric contactors 40 contact the surface of the substrate 10 and are separated by the primary insulators 33. The electric contactors 40 are made of polysilicon and function as the electric contacts for external circuits in the succeeding process.

Step S8—performing chemical mechanical polishing. In Step S8, the surfaces of the primary insulators 33 and the electric contactors 40 far from the substrate 10 are flattened via chemical mechanical polishing.

Figure 3A:
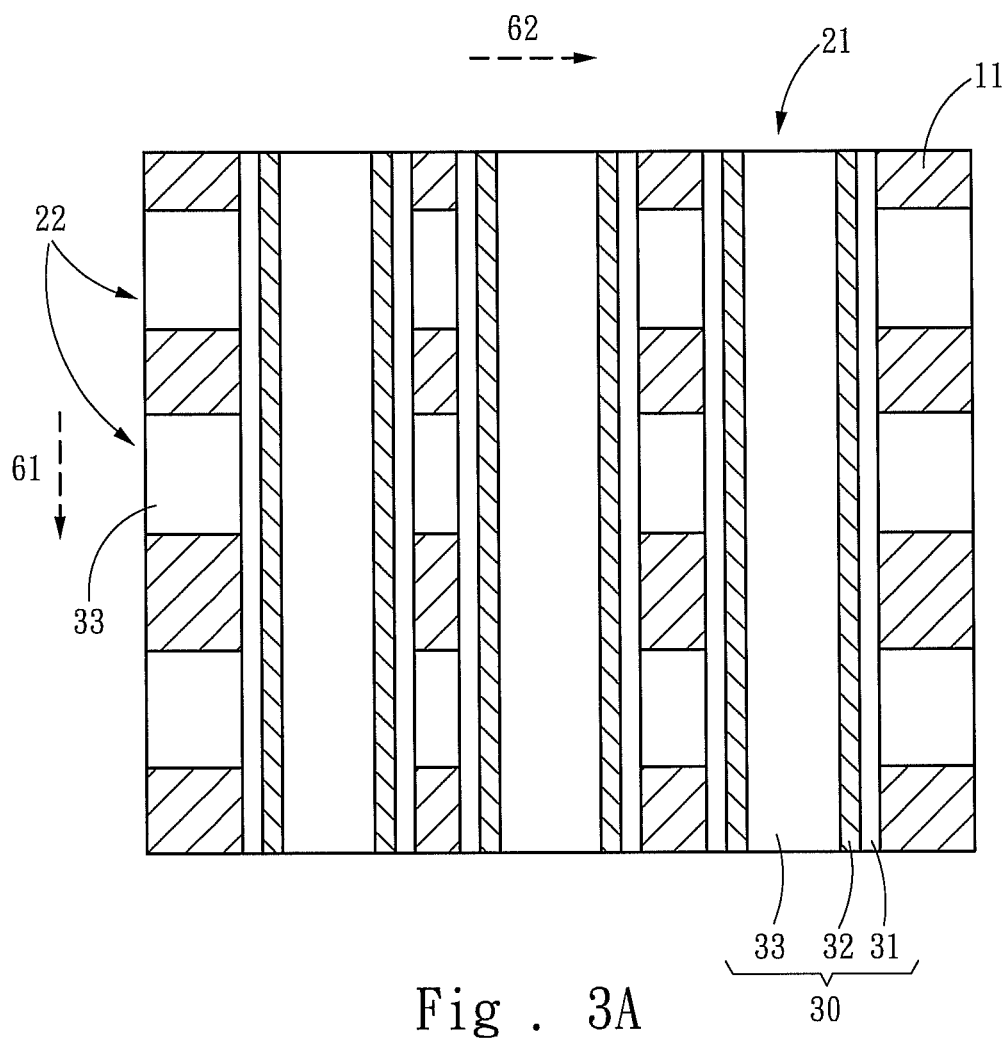
FIGS. 3A-3C are top views schematically showing a self-aligned etch process according to another embodiment of the present invention.
Figure 3B:
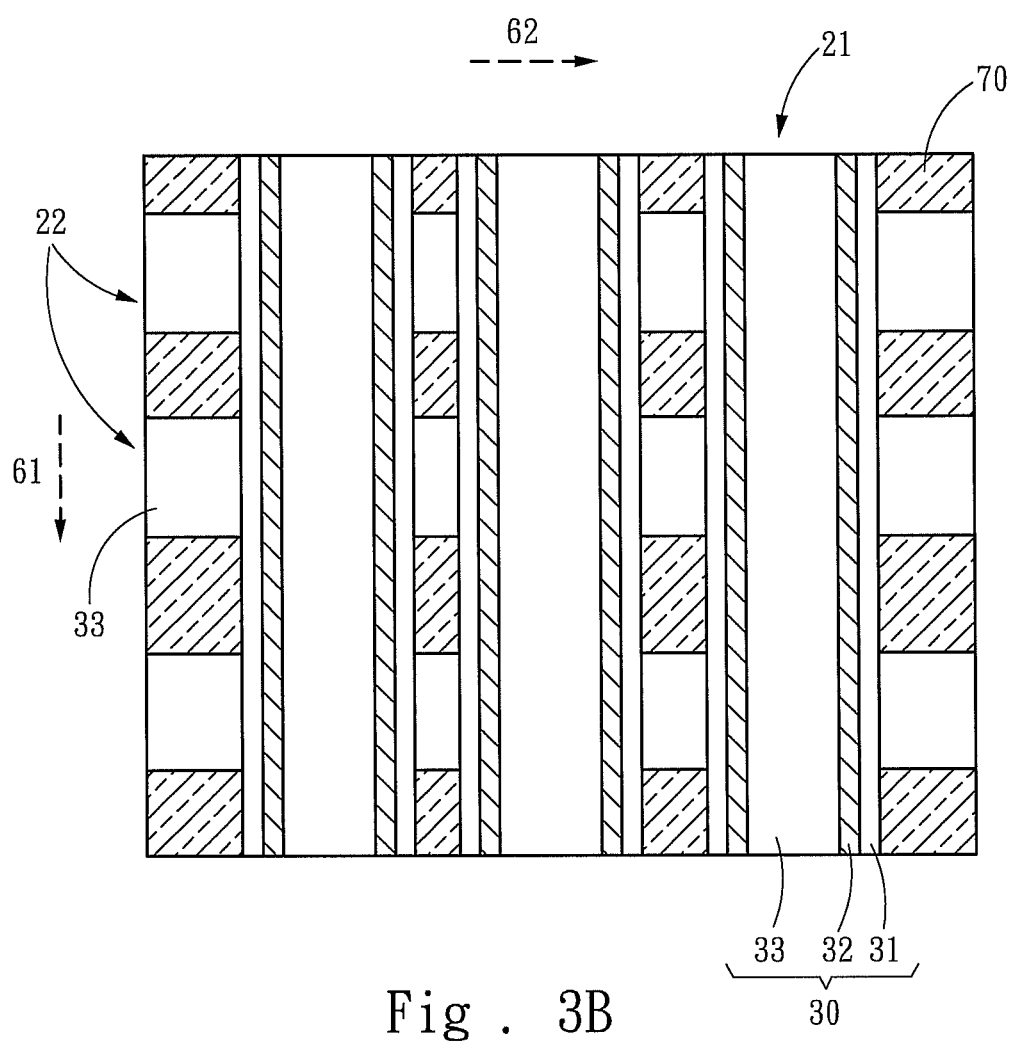
Figure 3C:
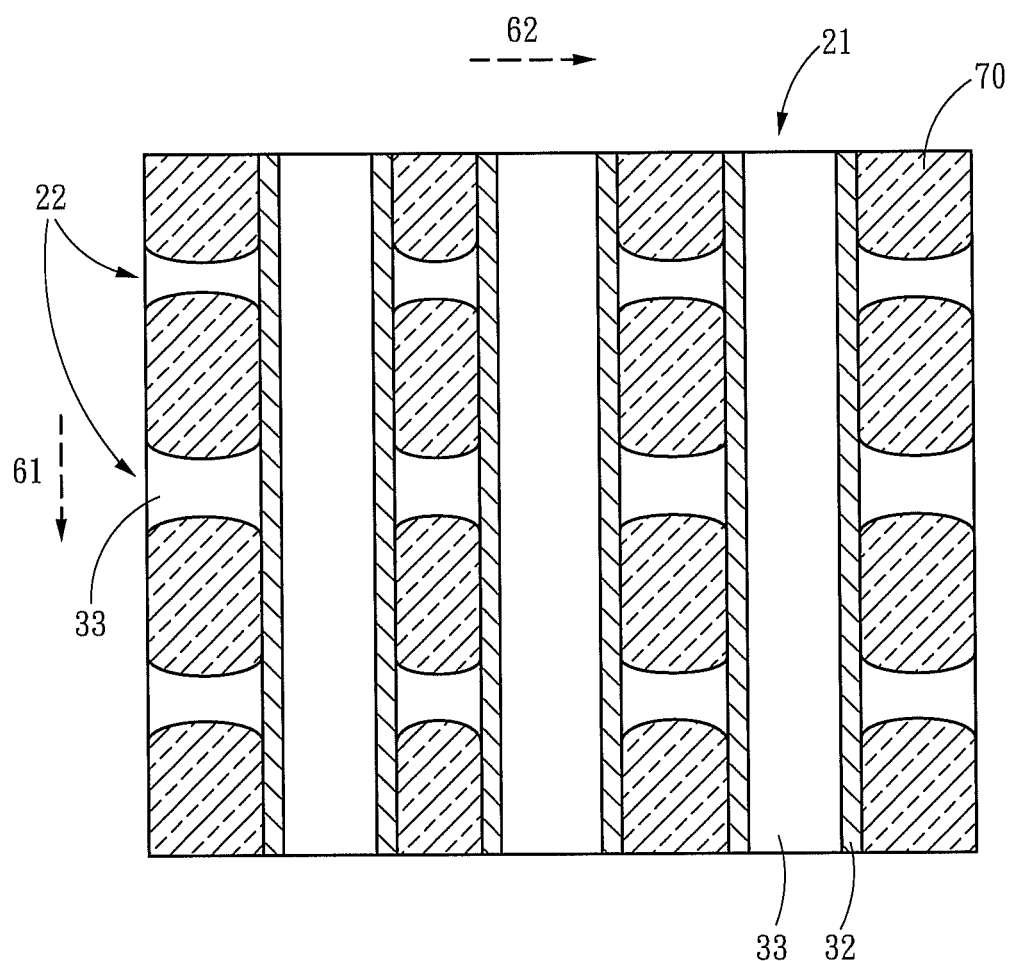

Below is described the application of the present invention to DRAM fabrication. FIG. 3A is a top view schematically showing Step S1 of a DRAM fabrication process according to one embodiment of the present invention. In Step S1, a substrate 10 is etched along a first direction 61 and a second direction 62 vertical to the first direction 61 to respectively form a plurality of first trenches 21 spaced from each other and a plurality of second trenches 22 also spaced from each other. Thereby a plurality of pillars 70 are formed between the first trenches 21 and the second trenches 22 as shown in FIG. 3B. Thus is formed an array structure. In this embodiment, the insulating layer 31, the etch stop layer 32 and the primary insulator 33 are only sequentially formed in the first trench 21. The insulating layer 31 and etch stop layer 32 are not formed on the surface of the second trench 22, but the primary insulator 33 is directly filled inside the accommodation space 50 of the second trench 22. Refer to FIG. 3B. Next, the etch protection layer 11 is removed to expose the pillars 70. Refer to FIG. 3C. Next, the insulating layer 31 is removed through a wet etching solution. In this step, the primary insulator 33 in the first trench 21 is protected by the etch stop layer 32 and exempted from being etched by the wet etching solution. However, the primary insulator 33 in the second trench 22 is etched by the wet etching solution and thus has smaller thickness. Thereby is achieved a one-way etching effect.

In DRAM fabrication, the pillars 70 are doped with ions, and at least one metal line (not shown in the drawings) is provided in each primary insulator 33 to function as gate or word line, whereby the pillars 70 can be fabricated into transistors in the succeeding process. As the metal line is provided inside the second trench 22, the width of the second trench 22 is greater than that of the first trench 21. In other words, the width of the pillar 70 is limited and reduced by the second trench 22. Therefore, by providing the etch stop layer 32 inside the first trench 21, the second trench 22 can be etched. Thereby, the area of the contact window between the pillar 70 and the neighboring second trench 22 is expanded lest the contact area decreases and the contact resistance during contacting increases.

In conclusion, the present invention uses the etch stop layer 32 to protect the primary insulator 33 from being etched by the wet etching solution, whereby is overcome the problems of uneven etched thickness caused by that the etching rate and etching time are hard to control. Thus, the present invention is exempted from the problem of short circuit occurring to the electric contactors 40 caused by excessively etching in the succeeding process. Further, the present invention only forms the etch stop layer 32 in a single direction to increase the area of the contact windows in another direction in the fabrication of the transistor array, whereby the contact resistance is decreased.

The present invention possesses utility, novelty and non-obviousness and meets the condition for a patent. Thus, the Inventors file the application for a patent. It is appreciated if the patent is approved fast.

The embodiments described above are only to exemplify the present invention but not to limit the scope of the present invention. Any equivalent modification or variation according to the spirit of the present invention is to be also included within the scope of the present invention.

What is claimed is:

1. A self-aligned wet etching process, comprising the steps of:
   Step S1: etching a substrate including an etch protection layer on a surface thereof to form a plurality of trenches spaced from each other;
   Step S2: sequentially forming an insulating layer and an etch stop layer on a surface of each of the plurality of trenches to form an accommodation space inside the etch stop layer;
   Step S3: filling a primary insulator inside the accommodation space, wherein the primary insulator integrates with the etch stop layer and the insulating layer to form a multi-layer isolator;
   Step S4: removing the etch protection layer to expose a portion of the isolator outside the substrate;
   Step S5: removing the insulating layer exposing outside the substrate through a wet etching solution, wherein the primary insulator is protected by the etch stop layer and exempted from being etched by the wet etching solution;
   Step S6: removing the etch stop layer exposing outside the substrate to expose a portion of the primary insulator outside the substrate; and
   Step S7: forming a plurality of electric contactors on the substrate that are separated by the primary insulator,
   wherein in the Step S1, the substrate is etched in a first direction and a second direction vertical to the first direction to respectively form a plurality of first trenches spaced from each other and a plurality of second trenches spaced from each other with a plurality of pillars formed between the plurality of first trenches and the plurality of second trenches.

2. The self-aligned wet etching process according to claim 1, wherein the substrate is made of silicon, and wherein the etch protection layer and the etch stop layer are made of silicon nitride, and wherein the insulating layer and the primary insulator are made of silicon dioxide, and wherein the plurality of electric contactors are made of polysilicon.

3. The self-aligned wet etching process according to claim 1 further comprising a Step S8 executed after the Step S7 to flatten the surfaces of the primary insulators and the electric contactors far from the substrate via chemical mechanical polishing.

4. The self-aligned wet etching process according to claim 1, wherein in the Step S2, the insulating layer and the etch stop layer are formed on a surface of each of the plurality of first trenches.

5. The self-aligned wet etching process according to claim 1, wherein the plurality of pillars are doped with ions.

* * * * *